US005430369A

United States Patent [19]

Bolomey et al.

[11] Patent Number: 5,430,369

[45] Date of Patent: Jul. 4, 1995

[54] DEVICE FOR MEASURING, AT A PLURALITY OF POINTS OF A SURFACE, THE MICROWAVE FIELD RADIATED BY A SOURCE

[75] Inventors: Jean-Charles Bolomey, Paris; Dominique Picard, Bagneux, both of France

[73] Assignee: Sociéte d'Applications Technologiques de l'Imagerie, France

[21] Appl. No.: 962,788

[22] PCT Filed: Jun. 14, 1991

[86] PCT No.: PCT/FR91/00479

§ 371 Date: Jan. 11, 1993

§ 102(e) Date: Jan. 11, 1993

[87] PCT Pub. No.: WO91/19990

PCT Pub. Date: Dec. 26, 1991

[30] Foreign Application Priority Data

Jun. 14, 1990 [FR] France ................................ 90 07406

[51] Int. Cl.[6] ................................ G01R 1/04

[52] U.S. Cl. ................................ 324/95

[58] Field of Search ................................ 324/158, 95

[56] References Cited

U.S. PATENT DOCUMENTS 5,006,788 4/1991 Goulette et al. ...................... 324/95

5,177,437 1/1993 Henley ........................... 324/158 F

FOREIGN PATENT DOCUMENTS 065455 11/1982 European Pat. Off. .

069628 1/1983 European Pat. Off. .

2632417 12/1989 France .

WO8808529 11/1988 WIPO .

*Primary Examiner*—Kenneth A. Wieder

*Assistant Examiner*—Barry C. Bowser

*Attorney, Agent, or Firm*—Rosenman & Colin

[57] ABSTRACT

An antenna (3) charged by a diode (4) is arranged at each of the points of a surface (30). The source (1) and a collecting antenna (5) are arranged on the same side of this surface, in the vicinity of each other. A layer (32) of absorbent material is provided, one face of which fits the shape of the surface (30) and is arranged on the side of said surface (30) opposite that of the source (1) and of the collecting antenna (5). An addressing circuit (33) of the diodes (4) which fits the shape of the other face of the absorbent layer (32) is connected, via connections which pass through said layer (32) perpendicular to the surface (30), to each of the diodes (4). The use of the modulated diffusion method permits the measurement of the near field radiated by a transmission antenna or diffracted by an object illuminated by a microwave radiation.

11 Claims, 3 Drawing Sheets

90
34
33
32
30
3
4
3
4
31
13
5
1
ME
MC

DEVICE FOR MEASURING, AT A PLURALITY OF POINTS OF A SURFACE, THE MICROWAVE FIELD RADIATED BY A SOURCE

BACKGROUND OF THE INVENTION

The object of the present invention is a device for the measurement, at a plurality of points, of the microwave field radiated by a source, comprising:

at each of said points, at least one antenna, loaded by at least one diode, means for collecting the microwave radiation coming from each of said antennas, delivering a collected microwave signal, means for generating a low-frequency signal, multiplexing means, arranged between said generator means and each of said diodes, an addressing circuit connected, on the one hand, to said multiplexer and, on the other hand, to each of the diodes, and means for controlling the said multiplexer means in such a manner that at least one of said diodes is polarized by said low-frequency signal and in order, in response to said low-frequency signal and to said collected microwave signal, to generate a signal representative of the microwave field at the point where said antenna charged by said polarized diode is located.

Such a device makes it possible, for instance, when the source is an antenna to be characterized, to draw up, by the method known to the person skilled in the art as the "modulated diffusion method", a map of the field radiated by the antenna. It may also be used when the source, instead of being an antenna which is to be characterized is an object diffracting a microwave field produced by an auxiliary antenna the radiation pattern of which is known. One can thus, in non-destructive manner, check industrial objects or products or else study the diffraction by a body of complicated shape or composition.

From French Applications 2 614 416 and 2 632 417 devices of the above-defined type are known in which the measurement points are aligned.

These devices are therefore suitable for the carrying out, without mechanical displacement, of one-dimensional measurements of the microwave field, that is to say, along the line or curve on which the antennas are aligned, by the electronic scanning of them.

However, these devices are not suitable for the carrying out, without mechanical displacement, of two-dimensional measurements of the field so as to know the field on a surface.

Furthermore, these one-dimensional devices cannot be simply transposed to two-dimensional devices, due to the presence of the connections which connect each of the diodes to the multiplexer and which it is necessary to make invisible vis à vis the microwave field, in order not to disturb it. Now, while it is relatively simple to make these connections invisible when the antennas are aligned, as shown by the solutions described in the aforementioned applications 2 614 419 and 2 632 417, it is much more difficult to do so in the event that the antennas are distributed over a surface, without limiting the pass band and possibly the sensitivity of the device.

Furthermore, when it is desired to measure, at each point, the components of the field along two perpendicular directions of polarization, it is necessary to have at each of the points two doublet antennas which are perpendicular to each other, for instance. This considerably complicates the preceding problem related to the connections for the feeding of the low-frequency signal towards each of the antennas.

Furthermore, in the device described in Application 2 614 419, the network of antennas is arranged in the proximity of a microwave collecting antenna, comprising for instance a waveguide having a series of slits. From this there results a relatively complicated construction and a risk of interaction between the object being tested and the detection unit formed by the antenna network and the collector waveguide.

These problems do not arise in the device described in Application 2 632 417 due to the fact that the linear network is arranged at the focal point of a reflector, itself arranged at a distance from the path of radiation coming from the source. Due to the focussing employed, such a solution, however, cannot be transferred to a two-dimensional network of antennas.

Furthermore, from French Patent 2 509 064 a device is known which permits the formation of a two-dimensional image of a microwave field, known accordingly as a "microwave camera." This camera employs a two-dimensional network of doublet antennas, for which the problem related to the feed connections of the low-frequency modulation signal is controlled in particular by the use, immediately behind the network of antennas, of a plurality of microwave collector antennas in the form of horns, stacked one on the other and multiplexed. This solution, which employs a large number of horns and a microwave multiplexing is, however, complicated and of relatively high expense. Furthermore, it does not control the problem of the measurement, without mechanical displacement, of the components of the field along two perpendicular directions of polarization, or that related to the interaction with the antenna or object being tested.

From European Patent Application 0 065 455 a device of the type defined above is also known, in which:

the said antennas are distributed uniformly over a surface, and the said source and the said collecting means are disposed on the same side of said surface and in the vicinity of each other so that the path from said source towards said surface and the path from said surface towards said collecting means are close to each other.

In such a device, due to the fact that the antennas are distributed over a surface, it is possible to carry out two-dimensional measurements without moving the test object relative to the measuring device, by a simple electronic scanning of the network of antennas.

The addressing circuit, however, has the drawback that the collecting means are visible and therefore extensively disturb the measurements, aside from one or two narrow pass bands, which in any event is less than the octave. Furthermore, the compensation for the disturbance introduced by the addressing circuit cannot be contemplated in the case of crossed dipoles which are necessary for the measurement of two orthogonal polarizations.

SUMMARY OF THE INVENTION

The invention is directed at overcoming these drawbacks.

For this purpose, its object is a device of this type characterized by the fact that:

a layer of material is provided which absorbs the microwave radiation and the shape of one face of which fits said surface, the layer being arranged on the side of said surface opposite that of said source and of said collector means, and the said addressing circuit fits in shape the other face of said layer and is connected to each of said diodes via connections which pass through said layer perpendicular to said surface.

Due to the layer of absorbent behind which the addressing circuit is located, vis à vis the source and the collecting antenna, this addressing circuit is invisible to the microwave field. It can therefore have connections arranged in the most practical manner for effecting the addressing, without bothering to minimize interactions with the microwave field. In fact, the only connections which the microwave field may see are those located in the vicinity of the antennas. Now these connections, which pass through the absorbent layer, are perpendicular to the surface of said absorbent layer and, therefore, in the great majority of cases, perpendicular to the microwave field coming from the source. These connections, therefore, do not in practice disturb this microwave field. When it is desired to measure the two components of the field along two directions of polarization and when, for instance, two perpendicular doublet antennas are placed at each point, the increase in the complexity of the addressing circuit which results therefrom is no problem since this addressing circuit is not seen by the microwave field and can therefore be designed as an ordinary addressing circuit.

Furthermore, with respect to the object being tested, the network of antennas behaves primarily as the absorbent panel and therefore without risk of substantial interaction with this test object. One could further reduce this risk by covering the network of antennas with a thin layer of absorbent, at the price of a slight reduction in the sensitivity.

Finally, in the device of the invention, there is no microwave circuit near the network of antennas, the microwave collecting antenna being arranged in the vicinity of the microwave source. Such an arrangement on the one hand simplifies the production of the network of antennas and on the other the reduction to practice of the measurement device, to the extent that the microwave circuits can be regrouped in one and the same zone, for instance.

In the same way, the number of wires connecting the measuring device to the control electronics can be reduced very significantly by integration of the multiplexer and the low-frequency generator on the addressing circuit.

As the said microwave field is of a frequency which may assume any value within a range, each of said antennas is advantageously of dimensions less than the half wavelength at the maximum frequency of said range.

In this case, the behavior of the network is practically independent of the value of the frequency, aside from that corresponding to an adjacent wavelength of the distribution pitch of the antennas on the surface, and the device can be used for wide-band applications.

In one embodiment, the said connections which pass through said layer are electrical connections, possibly resistive in order to reduce the disturbances.

In another embodiment, the said connections which pass through said layer are optical connections and said diodes are photodiodes.

Two antennas are advantageously provided at each of said points, each of them being sensitive to the component of the field which is polarized linearly along a determined direction, and the two antennas are arranged so that two determined directions are perpendicular.

In this case, it is possible completely to characterize the field, whatever its orientation and polarization, since its two components which are polarized linearly along two perpendicular directions are determined.

Furthermore advantageously, the said layer comprises several sublayers of materials of different characteristics, so that said layer is absorbent over a frequency band.

Further advantageously, said source and said collector means comprise one and the same antenna.

In a special application, an object to be analyzed is arranged between, on the one hand, the said surface and, on the other hand, the said source and the said collector means.

Such an object is, for instance, a plate of any composite material, a wooden board, or else a piece of fabric the inhomogeneities of which may be made evident on basis of the variations in the transmission coefficient of the microwave field which passes through them.

In another application, the said surface is a part of the surface of a structure illuminated by said source.

In this case, it is possible to effect field mappings on complex structures such as armorings of ships, airplanes, missiles and satellites when they are illuminated by a microwave radiation, in order to study their behavior vis à vis a radar or a threatening electromagnetic field.

BRIEF DESCRIPTION OF THE DRAWINGS

The present invention will be better understood by means of the following description of several embodiments of the measuring device of the invention, read with reference to the accompanying drawing, in which.

DETAILED DESCRIPTION OF THE PREFERRED EMBODIMENTS

Figure 1:
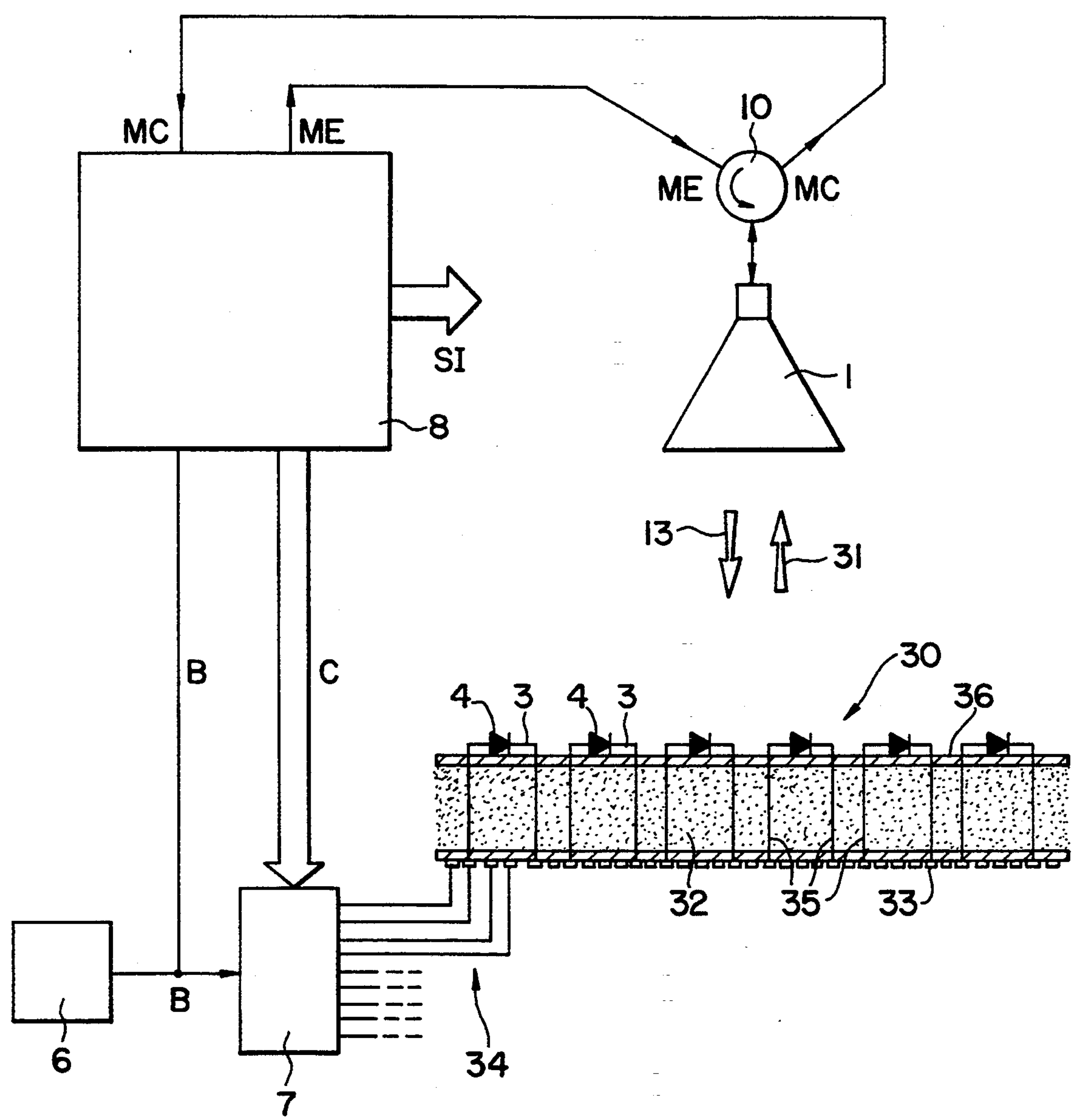
FIG. 1 is a top view of the device of the invention, used to measure the field radiated by an antenna.

Referring to FIG. 1, a system for measuring the near field radiated by a transmitting antenna 1, or tested antenna, will now be described.

Opposite the tested antenna 1, which is mounted fixed in position, there are arranged, regularly distributed over a surface 30, a series of antennas, in this case doublet antennas 3. As will be better understood from the following, each of these doublet antennas 3 permits the measurement of the field radiated by the tested antenna 1 at the point where this doublet antenna is located. Thus, one can draw up the map of the radiated near field on the surface 30 and deduce therefrom the far field radiation pattern of the tested antenna 1, for instance. One can also deduce therefrom the map of the very near field, in the opening of the antenna, in particular for diagnostic applications.

The antenna 1 is fed here via a circulator 10 which receives a microwave signal ME, delivered by a microwave generator included in an electronic circuit 8. The microwave signal ME here is a single-frequency signal.

The doublet antennas 3 arranged in a network on the surface 30 are here antennas of electric doublet type, that is to say, each comprising two identical aligned linear strands. The cathode of a diode 4 is connected to one of the strands and its anode is connected to the other strand, so that each of the doublet antennas 3 is loaded at its center by the diode 4, in this case of PIN type.

The doublet antennas 3 are here supported by an insulating substrate 36 of slight thickness. For example, they are obtained by engraving a metal layer applied on the substrate 36, in the manner of a printed circuit.

A layer 32 of material absorbing the microwave radiation, for instance, a carbon-filled plastic foam is arranged on the side of the surface 30 opposite the side where the antenna 1 is arranged, so that one of its faces fits in shape the substrate 36. The thickness of the layer 32 is sufficient to absorb the microwave radiation at the frequency of the signal ME. In known manner, it is between a few millimeters and a few centimeters.

An addressing circuit 33 of the network of diodes 4 fits in shape the face of the absorbent layer 32 opposite that which is applied against the substrate 36. The addressing circuit 33 is a printed circuit provided with a plurality of conductive tracks, each of them being connected on the one hand, via connections 34, to one of the outputs of a multiplexer 7 and, on the other hand, via connections 35, to each of the diodes 4. The connections 35 pass through the absorbent layer 32 perpendicular to the surface 30 and to the strands of the doublet antennas 3 in such a manner as not to disturb the component of the electromagnetic field measured due to each doublet antenna 3.

As the frequency of the microwave signal ME is capable of assuming any value within a range between a minimum value $F_m$ and a maximum value $F_M$, each of the said antennas is of a length less the minimum half wavelength λm/2, that is to say, the half wavelength of the microwave radiation at the maximum frequency $F_M$.

The addressing circuit 33 is so arranged that the strands of each doublet antenna 3 are connected to one of the outputs of the multiplexer 7, in a number equal to that of the doublet antennas 3. The multiplexer 7 receives at its single input a low-frequency signal B coming from a generator 6.

By "low-frequency signal" there is understood here a square or sinusoidal periodic signal the frequency range of which is considerably lower than the range of the frequencies commonly referred to as microwave frequencies. Thus, as one can permit the microwave range to have a lower limit of a few hundred megahertz, the signal B will, in principle, have a frequency less than a few tens of megahertz.

The microwave radiation coming from each of the doublet antennas is collected here by the antenna 1 itself, the corresponding collected microwave signal MC being available at the output of the circulator 10.

The path of the microwave radiation from the antenna 1 towards the surface 30, symbolized by the arrow 13, is therefore here superimposed on the path of the radiation from the surface 30 towards the antenna 1, symbolized by the arrow 31.

An electronic circuit 8, managed by means of a microprocessor, is provided with a microwave input receiving the microwave signal MC, a low-frequency input receiving the signal B, a microwave output delivering the microwave signal ME, a digital output delivering a control signal C for the multiplexer, and an output delivering a signal SI representative of the microwave field measured and applied, for instance, to a recording device, not shown since known.

The device which has just been described operates as follows.

At each moment, the microprocessor of the electronic circuit 8 controls the multiplexer 7 so that the signal B is applied to a single one of the doublet antennas 3, and therefore to a single one of the diodes 4. Thus, only that diode is polarized in succession in one direction and the other, in the tempo of the signal B.

At the same time, the microwave radiation coming from the tested antenna 1 illuminates the surface 30 and the diffracted field at the level of each of the doublet antennas 3 is a sample of the field radiated by the tested antenna 1 at the point where said doublet antenna is located.

All of the radiations coming from each of the doublet antennas 3 are collected by the antenna 1, giving rise to the collected microwave signal MC.

In the electronic circuit 8, the collected microwave signal MC undergoes a microwave synchronous detection by means of the microwave signal ME, and then a second low-frequency synchronous detection by means of the signal B. Now, among all of the radiations collected, only the radiation coming from the doublet antenna 3, charged by the diode polarized by the signal B, is modulated by this signal B. Therefore, the signal MC, after microwave detection and then low-frequency detection, is representative only of the field at the point where the doublet antenna 3 charged by the diode 4 polarized by means of the signal B is located. The microprocessor of the circuit 8 can therefore control the successive polarization of each of the diodes 4 and develop, from the signal C, which indicates the location of the measurement point, and the signal resulting from the double detection which indicates the value of the field at this measurement point, a control signal SI for the recording device.

This type of operation, which results from the use of the method known by the person skilled in the art by the name of the "modulated diffusion method" is described in U.S. Pat. No. 4,552,151.

The electronic circuit 8, which therefore comprises principally a microwave generator, a control microprocessor, and a microwave synchronous detector followed by a low-frequency synchronous detector is within the scope of the person skilled in the art and will therefore not be further described.

In order to measure the field radiated along two orthogonal polarizations, it is possible to provide, at each point of the line 30, in a manner not shown out of desire for simplicity, two doublet antennas analogous to the antenna 3, which are arranged perpendicular to each other. There are thus obtained two series of doublet antennas. The first series is, for instance, arranged vertically in order to be sensitive to the vertical component of the field. It is connected to a first multiplexer receiving a first low-frequency signal. The second series is arranged horizontally in order to be sensitive to the horizontal component of the field. It is connected to a second multiplexer receiving a second low-frequency signal of a frequency different from that of the first low-frequency signal. The electronic circuit 8 is so arranged that the microwave signal collected, after the microwave synchronous detection, undergoes two low-frequency synchronous detections, one at the frequency of the first low-frequency signal and the other at the frequency of the second low-frequency signal, which permits the simultaneous detection of the two components of the field at each point.

One could also use only a single multiplexer having a double number of channels, successively polarizing each of the diodes of the two series of doublet antennas so as to determine, in succession, the two components of the field at a point.

When operating at a frequency close to the minimum frequency $F_m$ for which the device has been contemplated, it is possible, particularly if the device has been contemplated for a wide frequency rage, simultaneously to modulate, by means of the signal B, a package of several diodes 4 belonging to adjacent doublet antennas 3.

In fact, in general, these diodes are arranged along a pitch of $\lambda_m/2$ in order to obtain a satisfactory spatial sampling of the field when operating at the maximum frequency $F_M$, and therefore at the minimum wavelength $\lambda_m$. On the other hand, when effecting measurements at higher wavelengths, it is not necessary to have a spatial sampling pitch equal to $\lambda_m/2$, and, in order to save time and increase the sensitivity, the electronic circuit 8 can be so arranged that the modulation of the diodes 4 takes place by packages of suitable size.

Figure 3:
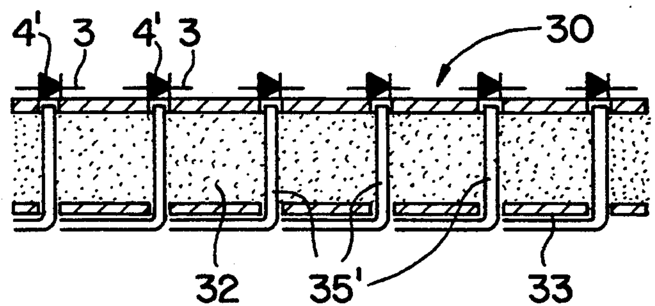
FIG. 3 shows a variant embodiment of the network of antennas of the device of FIG. 1.

It is not necessary to use PIN diodes, and one can replace them by photodiodes. In such case, as shown in FIG. 3, the electrical connections 35 which pass through the absorbent layer 32 are replaced by optical connections, in the present case optical fibers 35' the ends of which are arranged facing each of the photodiodes 4'. In this case, the disturbance of the microwave field by the feed connections of the low-frequency signal B at each of the photodiodes is zero, whatever the orientation of the fibers 35'.

In the event that the frequency range of the microwave field is relatively wide, the absorbent layer 32 may comprise several sublayers of materials of different characteristics in order to assure a good coefficient of absorption throughout the entire range of the operating frequencies.

Figure 2:
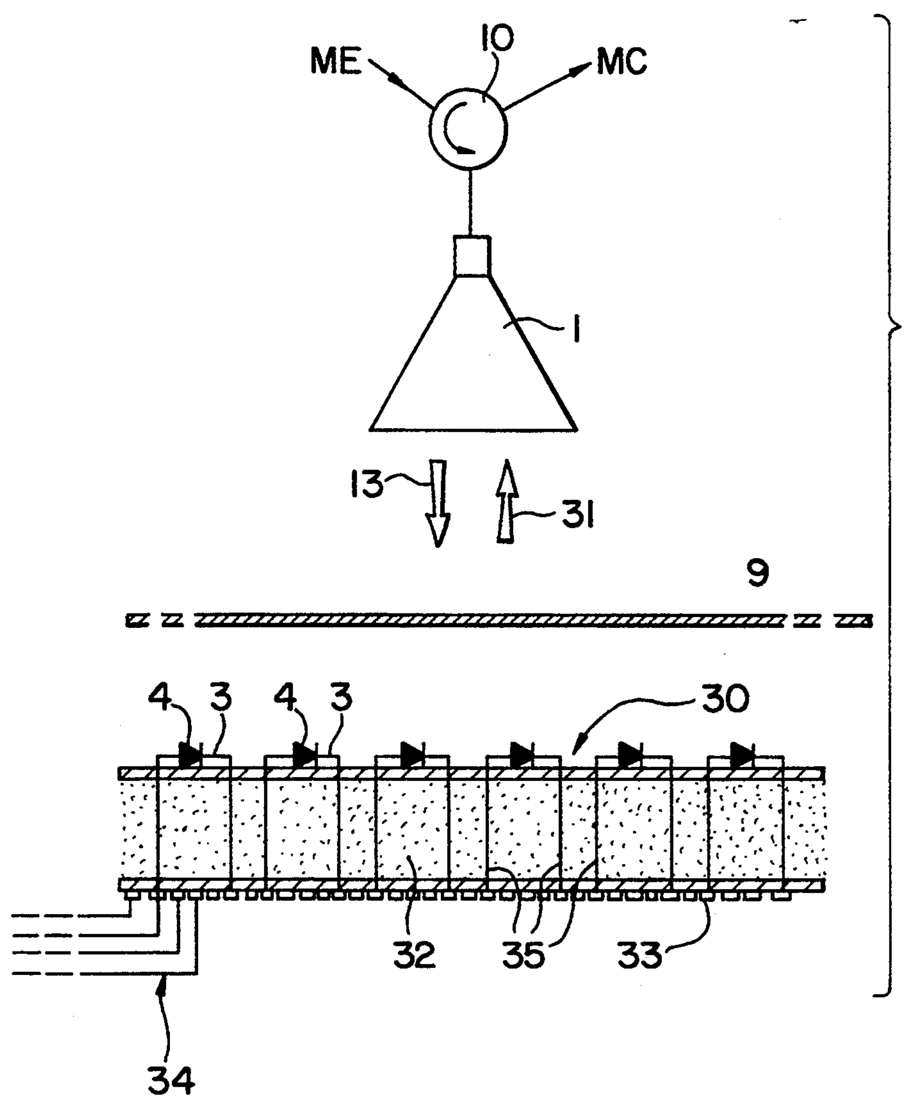
FIG. 2 is a top view of a part of the device of FIG. 1, used to measure the transmission characteristics of a test plate, in accordance with the so-called "double transmission" circuit.

In FIG. 2, the measurement device is no longer used to characterize the antenna 1 but, rather, a plate 9 of a material the homogeneity of which, for instance, is to be checked. In this case, one uses an antenna 1 of known characteristics, selected, for instance, in order to obtain as uniform an illumination of the plate 9 as possible. One thus operates with double transmission, since the plate 9 is passed through the first time by the microwave radiation coming from the antenna 1, as indicated by the arrow 13, and a second time by the microwave radiation coming from the network of antennas 3 of the surface 30, as shown by the arrow 31. However, as the forward and return paths are superposed, the field modulated by the signal B when a diode 4 is modulated by this signal is connected to the coefficient of transmission of the plate 9 at the place where it is passed through by the radiation extending toward said diode 4 or coming from it.

Naturally, when the plate 9 is larger than the network of antennas 3, or when one is checking a strip product, it is possible to drive the plate 9 or strip so as to move in front of the network of antennas 3.

In this case, the network may comprise only one row of antennas which is arranged perpendicular to the plane of FIG. 2, a two-dimensional image of the object 9 being obtained by synchronizing the movement of passage and the scanning of the diodes 4.

In the case of FIG. 3, the distribution of the microwave circuits on a single side of the object 9 greatly facilitates the implantation of the device.

Figure 4:
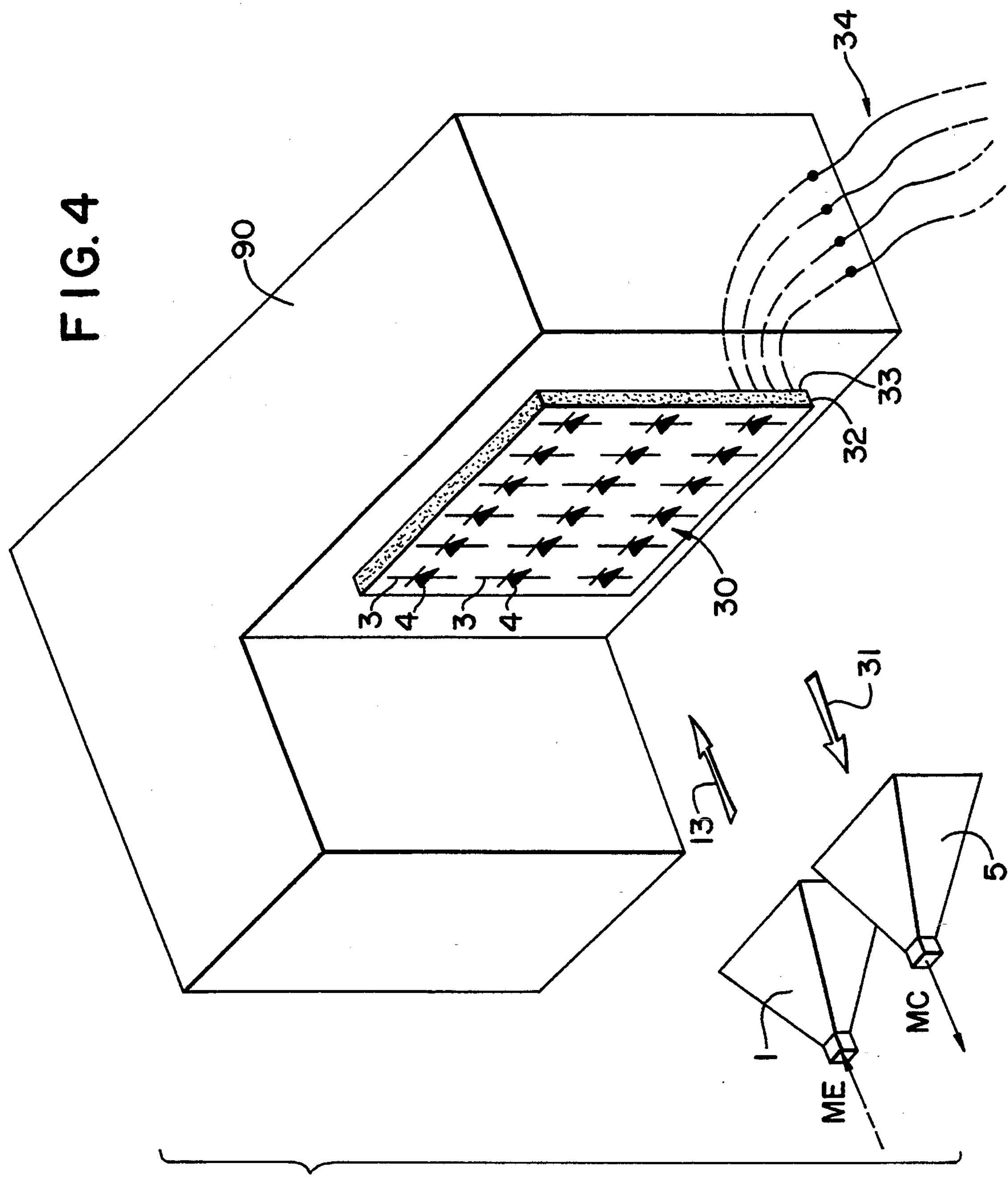
FIG. 4 shows the device of the invention used to measure the microwave field over a portion of the surface of a complex structure when said surface is illuminated by a source microwave radiation.

In FIG. 4, the surface 30 along which the network of antennas 3 extends is a part of the surface of a complex structure 90, in this case a metal armoring. It is thus possible to measure the field on the surface 30 when the structure 90 is illuminated by the source 1, taking into account the reflections of the radiation on the other parts of the surface.

In FIG. 4, a collecting antenna 5 is provided which is different from the transmitting antenna 1 but arranged on the same side of the surface 30 as said transmitting antenna 1 and in the vicinity thereof so that the path 31 from the surface 30 towards the collecting antenna 5 is close to the path 13 from the transmitting antenna towards the surface 30.

The connections 34 connecting the addressing circuit 33 to the multiplexer 7, which is not shown in FIG. 4, are within the structure 90, so as not to be seen by the microwave field.

In the application of FIG. 4, the arrangement of the microwave circuits within a single container facilitates the production of a portable device, which can be used for measurements on the site.

It is also possible to use the network of antennas 3 in order to measure the field reflected by a reflecting object illuminated by the antenna 1.

It is obviously possible to use two separate antennas for the transmission and reception, such as the antennas 1 and 5 of FIG. 4, in the devices of FIGS. 1 to 3, in the same way as it would be possible to use a circulator and a single antenna, like the circulator 10 and the antenna 1 of FIG. 1, in the device of FIG. 4.

It is not necessary for the surface 30 to be flat and in certain practical cases, such as the study of radomes of complicated shape, the flat surface may be any skew surface, a hemisphere, and so on.

It is to be noted that the measurement with a single antenna runs the risk of introducing, in known manner, a phase ambiguity in the measurement in which one measures a phase which is not always the double of the actual phase. This not a problem in all applications. For those in which this phase ambiguity may be disturbing it is possible to take it into account by the use, in known manner, of a phase development algorithm.

It is not necessary to have, as has been described, one diode in the center of each doublet antenna. Thus, one can arrange several diodes per doublet antenna, for instance two, one at one-third and the other at two-thirds of the total length of the doublet.

Similarly, it is not necessary to use doublet antennas, and they can be replaced by antennas of any other type, each being of small dimension in view of the minimum wavelength $\lambda_m$.

For example, one can use patch antennas, spiral antennas and multi-strand wire antennas.

It would also be possible, in accordance with an important improvement of the invention, to improve the modulation in the case of diodes. In all the addressing systems previously described, the non-linear element, in the present case the diode, is directly modulated by the line-column addressing connections coming from the multiplexer. This arrangement has the advantage of simplicity, but there results therefrom a parasitic modulation of the unaddressed diodes, in particular because they are imperfectly blocked.

In the arrangement described above in which the addressing circuit is hidden by a layer of absorbent materials, it becomes possible to avoid the parasitic modulations of this type by adding to each of the elements of the network a logical circuit which makes it possible to modulate only a single diode at a time, all the others being effectively blocked.

By way of example, one can use a logical gate in series with the diode and controlled by the line-column addressing signals and delivering the modulation signal only when its validation conditions are satisfied.

I claim:

1. A device for measuring at a plurality of points the microwave field radiated by a source (1), said device comprising:

at least one antenna (3) loaded by at least one diode (4) at each of said points, said points being distributed over a surface (30);

means (1, 10; 5) for collecting the microwave radiation coming from each of said antennas (3), so as to produce a collected microwave signal (MC), said source and said collecting means being arranged on the same side of said surface (30) and in the vicinity of each other so that the path (93) from said source (1) towards said surface (30) and the path (31) from said surface (30) towards said collecting means (1, 10; 5) are close to each other, multiplexing means (7) arranged between said generating means (6) and each of said diodes (4);

an addressing circuit connected between said multiplexer and each of the diodes;

means (8) for controlling said multiplexer means (7) so that at least one of said diodes (4) is addressed by said low-frequency signal (B) and, in response to said low-frequency signal (B) and collected microwave signal (MC), a signal (SI) is produced that is representative of the microwave field at the points where said antennas (3) having diodes (4) addressed by said low-frequency signal are located; and a layer (32) of microwave radiation absorbing material located on the side of said surface (30) opposite that of said source (1) and of said collector means (1, 10; 5), said layer being located between said surface and the other face (32) said addressing circuit (33) so that said addressing circuit (33) is connected to each of said diodes via connections (35) which pass through said layer (32).

2. A device according to claim 1, in which, the said microwave field being of a frequency which can assume any value within a range, each of said antennas (3) has dimensions less than the half wavelength at the maximum frequency of said range.

3. A device according to claim 1, in which the said connections (35) which pass through said layer (32) are electrical connections.

4. A device according to claim 1, in which the said connections (35') which pass through the said layer (32) are optical connections and the said diodes are photodiodes (4').

5. A device according to claim 1, in which, at each of said points there are provided two antennas (3), each of them being sensitive to that component of the field which is linearly polarized along a given direction, and the two antennas (3) are arranged so that the two given directions are perpendicular.

6. A device according to claim 1, in which the said layer (32) comprises several sublayers of materials of different characteristics, so that said layer is absorbent on a frequency band.

7. A device according to claim 1, in which said source (1) and said collecting means (1, 10) comprise the same antenna (1).

8. A device according to claim 1 in which an object to be analyzed (9) is arranged between, on the one hand, the said surface (30) and, on the other hand, the said source (1) and the said collecting means (1, 10).

9. A device according to claim 8, in which the said object to be analyzed (9) is driven past.

10. A device according to claim 1, in which the said surface (30) is a part of the surface of a structure (90) illuminated by said source (1).

11. A device according to of claim 1, in which the said multiplexing means (7) and the said means (6) for the generating of a low-frequency signal (B) are integrated on said addressing circuit (33).

* * * * *